(12) United States Patent
Li et al.

(10) Patent No.: US 10,983,448 B2
(45) Date of Patent: Apr. 20, 2021

(54) OBJECTIVE LENS PROTECTION DEVICE, OBJECTIVE LENS SYSTEM AND LITHOGRAPHIC DEVICE

(71) Applicant: SHANGHAI MICRO ELECTRONICS EQUIPMENT (GROUP) CO., LTD., Shanghai (CN)

(72) Inventors: Xianming Li, Shanghai (CN); Baotong Hao, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 0 days.

(21) Appl. No.: 16/632,812

(22) PCT Filed: Jul. 23, 2018

(86) PCT No.: PCT/CN2018/096594
§ 371 (c)(1),
(2) Date: Jan. 21, 2020

(87) PCT Pub. No.: WO2019/015687
PCT Pub. Date: Jan. 24, 2019

(65) Prior Publication Data
US 2020/0166856 A1 May 28, 2020

(30) Foreign Application Priority Data
Jul. 21, 2017 (CN) .......................... 201710602722.8

(51) Int. Cl.
G03F 7/20 (2006.01)
G02B 27/00 (2006.01)

(52) U.S. Cl.
CPC ..... *G03F 7/70916* (2013.01); *G02B 27/0006* (2013.01); *G03F 7/7015* (2013.01);
(Continued)

(58) Field of Classification Search
CPC .............. G02B 27/0006; G03F 7/7015; G03F 7/70841; G03F 7/70825; G03F 7/70858;
(Continued)

(56) References Cited

U.S. PATENT DOCUMENTS 9,176,394 B2 11/2015 Poon et al.
2001/0038442 A1 11/2001 Hansell et al.
(Continued)

FOREIGN PATENT DOCUMENTS

CN 201236208 Y 5/2009
CN 202837812 U 3/2013
(Continued)

*Primary Examiner* — Colin W Kreutzer
(74) *Attorney, Agent, or Firm* — Muncy, Geissler, Olds & Lowe, P.C.

(57) ABSTRACT

An objective lens protection device, objective lens system and lithographic device. The objective lens protection device includes a main structure provided with, oppositely disposed, an air supply unit and extraction unit. The air supply unit is used to output air. The extraction unit extracts air output by the air supply unit to form at least one layer of air curtain between the air supply unit and extraction unit. The objective lens protection device can effectively control the flow rate of wind discharge, controlling wind in a laminar flow state and ensuring uniform flow field of the air curtain, and can effectively block organic matters volatilized from the bottom up, eliminate opportunity for a direct contact of the organic matters with the lens, and prevent objective lens from contamination by the volatilization of the organic matters of photoresist, thus ensuring the imaging quality of the objective lens.

24 Claims, 7 Drawing Sheets

(52) U.S. Cl.
CPC ...... *G03F 7/70825* (2013.01); *G03F 7/70841* (2013.01); *G03F 7/70858* (2013.01); *G03F 7/70883* (2013.01); *G03F 7/70908* (2013.01); *G03F 7/70933* (2013.01)

(58) Field of Classification Search
CPC ............. G03F 7/70883; G03F 7/70908; G03F 7/70916; G03F 7/70933
USPC ...................................... 355/30, 67; 359/509
See application file for complete search history.

(56) References Cited

U.S. PATENT DOCUMENTS

| | | | |
|---|---|---|---|
| 2002/0000519 A1 | 1/2002 | Tsukamoto | |
| 2003/0146396 A1* | 8/2003 | Loopstra | G03F 7/70716 250/492.2 |
| 2003/0169407 A1* | 9/2003 | Hasegawa | G03F 7/70883 355/30 |
| 2004/0212791 A1* | 10/2004 | De Bokx | G03F 7/70933 355/30 |
| 2005/0030496 A1* | 2/2005 | Chibana | G03F 7/70933 355/30 |
| 2005/0264773 A1* | 12/2005 | Beckers | G03F 7/70933 355/30 |
| 2006/0146300 A1* | 7/2006 | Simon | G03F 7/70933 355/30 |
| 2008/0129971 A1* | 6/2008 | Sakamoto | G03F 7/70933 355/30 |
| 2008/0137192 A1* | 6/2008 | Soyez | G03F 7/7015 359/509 |
| 2015/0355557 A1* | 12/2015 | Cuypers | G03F 7/70725 355/72 |
| 2016/0004174 A1* | 1/2016 | Walter | G03F 7/70266 355/30 |

FOREIGN PATENT DOCUMENTS

| | | |
|---|---|---|
| CN | 203426605 U | 2/2014 |
| CN | 205967805 U | 2/2017 |
| CN | 107783283 A | 3/2018 |
| JP | 2003532304 A | 10/2003 |
| JP | 2006013502 A | 1/2006 |
| JP | 2015134364 A | 7/2015 |
| JP | 2019525259 A | 9/2019 |
| WO | WO-2011/068249 A2 | 6/2011 |

* cited by examiner

OBJECTIVE LENS PROTECTION DEVICE, OBJECTIVE LENS SYSTEM AND LITHOGRAPHIC DEVICE

TECHNICAL FIELD

The present invention relates to the field of semiconductor and optical technology and, in particular, to an objective lens protection device, an objective lens system and a photolithographic apparatus.

BACKGROUND

An objective lens, as a crucial component in a photolithography machine, directly determines the imaging quality of the production. The lowermost lens of the objective lens is usually located in very close vicinity of a substrate (at a distance of about 40 mm therefrom) being processed. When the photolithography machine is used to perform an exposure process, the organic solvent contained in the photoresist coating coated on the surface of the substrate being processed continuously and slowly volatilizes under the action of exposure. With continuous operation of the photolithography machine, the volatilized organic solvent adhere to a lower surface of the objective lens, and form a contaminating organic film on the lower surface of the lowermost lens, which may greatly deteriorate the light transmittance of the objective lens, reduce imaging quality of the substrate and quality of the production.

In order to overcome the above problems, methods that have been proposed so far are mainly as follows:

1. In order to ensure high imaging quality, the surface of the lowermost lens may be regularly wiped to remove the adhered organic contamination. However, even the most careful wiping may inevitably impose an adverse effect on the lens' coating film or even lead to irreversible damages. Therefore, this contact approach is inappropriate to be frequently used and suffers from different results due to the degree of proficiency of the operator and other factors, thereby resulting in a difficult control of the product uniformity.

2. A holder with an extremely thin protective film for preventing the adherence of organic solvents to the lens surface may be mounted under the lowermost lens of the objective lens. Although this method can effectively prevent lens contamination, the protective film has to be subject to transmittance of light that is by nature a form of energy, thereby shortening the service life of the film. Moreover, limited by the current technology, the extremely thin protective film cannot be easily mounted and is prone to rupture (at a percentage of up to 15%) due to influence of the exoteric gas pressure. Further, depending on requirements of the energy of transmission light and the imaging quality, the protective film must be replaced after use for a period of 30 to 60 days, thus interrupting the continuously efficient operation of the equipment and augmenting the manufacturer's user-cost.

Therefore, there is a need for a process method capable of continuously and efficiently preventing lens contamination in a stable and reliable manner.

SUMMARY

In view of the above, it is an object of the present application to provide an objective lens protection device, an objective lens system and a photolithographic apparatus, so as to solve the problem of easy contamination of an objective lens.

To solve the above technical problem, the present application provides an objective lens protection device comprising a main body, the main body having a gas injection unit and a first extraction unit that are oppositely arranged. The gas injection unit is configured to deliver a gas, and the first extraction unit is configured to extract the gas delivered by the gas injection unit, so as to form at least one layer of air curtain between the gas injection unit and the first extraction unit.

Optionally, the gas injection unit may have a gas injection surface that is perpendicular to a gas injection direction of the gas injection unit, and provided with a plurality of gas injection ports thereon, wherein the first extraction unit has a first gas extraction surface that is provided with a plurality of first gas extraction ports thereon, and wherein each of the plurality of gas injection ports corresponds to and is arranged opposite to a corresponding one of the plurality of first gas extraction ports.

Optionally, each of the gas injection surface and the first gas extraction surface may have a stepped profile.

Optionally, the gas injection surface and the first gas extraction surface may be axisymmetrically distributed.

Optionally, the gas injection surface may comprise a plurality of gas injection surface portions that are not located in a same plane, and the plurality of gas injection surface portions are parallel to each other.

Optionally, the gas injection unit may further comprise a plurality of non-gas-injection surfaces, wherein each of the non-gas-injection surfaces is configured to connect two adjacent gas injection surface portions and has no gas injection port, and an angle between one of the non-gas-injection surfaces and a corresponding one of the gas injection surface portions is 85°-95°.

Optionally, the first gas extraction surface may comprise a plurality of first gas extraction surface portions that are not located in a same plane, and the plurality of first gas extraction surface portions are parallel to each other.

Optionally, the first extraction unit may further comprise non-gas-extraction surfaces, wherein each of the non-gas-extraction surfaces is configured to connect two adjacent gas extraction surface portions and has no first gas extraction port, and an angle between one of the non-gas-extraction surfaces and the first gas extraction surface is 85°-95°.

Optionally, the gas injection unit may further comprise a gas inlet port that is in communication with each of the plurality of gas injection ports, and the first extraction unit further comprises a gas outlet port that is in communication with each of the plurality of first gas extraction ports.

Optionally, the main body may further comprise a second extraction unit having an annular second gas extraction surface, the second gas extraction surface being located at a lower surface of the main body.

Optionally, the second gas extraction surface may be provided with a plurality of second gas extraction holes.

Optionally, the gas extraction direction of the second gas extraction surface may be not parallel to the gas injection direction of the gas injection unit.

Optionally, the gas extraction direction of the second gas extraction surface may be perpendicular to the gas injection direction of the gas injection unit.

Optionally, the second extraction unit may be provided with a second extraction chamber, into which a gas is extracted by the second gas extraction surface.

Optionally, the first extraction unit may comprise a first extraction chamber that is in communication with the gas outlet port, wherein the gas is extracted and enters into the first extraction chamber through the plurality of first gas extraction ports and discharged through the gas outlet port, and wherein the first extraction chamber and the second extraction chamber are in communication with each other.

Optionally, the main body may further comprise a connecting part that is configured to connect the objective lens and is located at one side of the main body.

Optionally, the connecting part may be a threaded interface.

Optionally, the objective lens protection device may further comprise a physical protection layer that is connected to the main body and located between the objective lens to be protected and the at least one layer of air curtain.

Optionally, the physical protection layer may be made of glass or resin.

Optionally, the objective lens protection device may further comprise a sealing element that is configured to seal a gap between the physical protection layer and the main body and is located between the physical protection layer and the main body.

Optionally, the main body may be integrally formed.

To solve the above problem, another aspect of the present application provides an objective lens system comprising the objective lens protection device as defined above.

To solve the above problem, the present application also provides a photolithographic apparatus comprising the above objective lens system.

The objective lens protection device provided in the present application has the following beneficial advantages:

1. An air curtain is formed between the gas injection unit and extraction unit. When the device is in operation, the wind speed is effectively controlled to keep the wind in a laminar flow state by the uniformly and densely arranged transverse gas injection ports, thereby allowing an ensured uniform flow field for the air curtain. Moreover, with the aid of the first gas extraction ports, a layer of air curtain capable of covering the whole lens is formed, thereby enabling to effectively block the organics volatilized from bottom to up and eliminate the chance to come into direct contact with the lens. As a result, contamination of the objective lens by organic volatilization from photoresist is able to be prevented, ensuring imaging quality of the objective lens.

2. The vertical second gas extraction ports can extract organic volatilization to alleviate contamination of other components. Likewise, the uniformly and densely arranged second gas extraction ports are able to effectively control a flow field of the extraction gas flow, thereby allowing the volatile substance to be extracted out of the system without disturbing the air curtain.

3. The physical protection layer provides a secondary physical protection, allowing that no contact is present between the volatile contaminant and the lens.

4. The gas injection ports, first gas extraction ports and second gas extraction ports are all uniformly and densely arranged circular through-holes, enabling to effective control flow rate of the gas injection flow and gas extraction flow to keep them in a laminar flow state. As a result, the stable air curtain is able to be ensured, and a good blockage effect of the air curtain and a sufficient extraction are able to be proved.

5. The main body is integrally formed, allowing the device to be more compact and space-saving.

Figure 1:
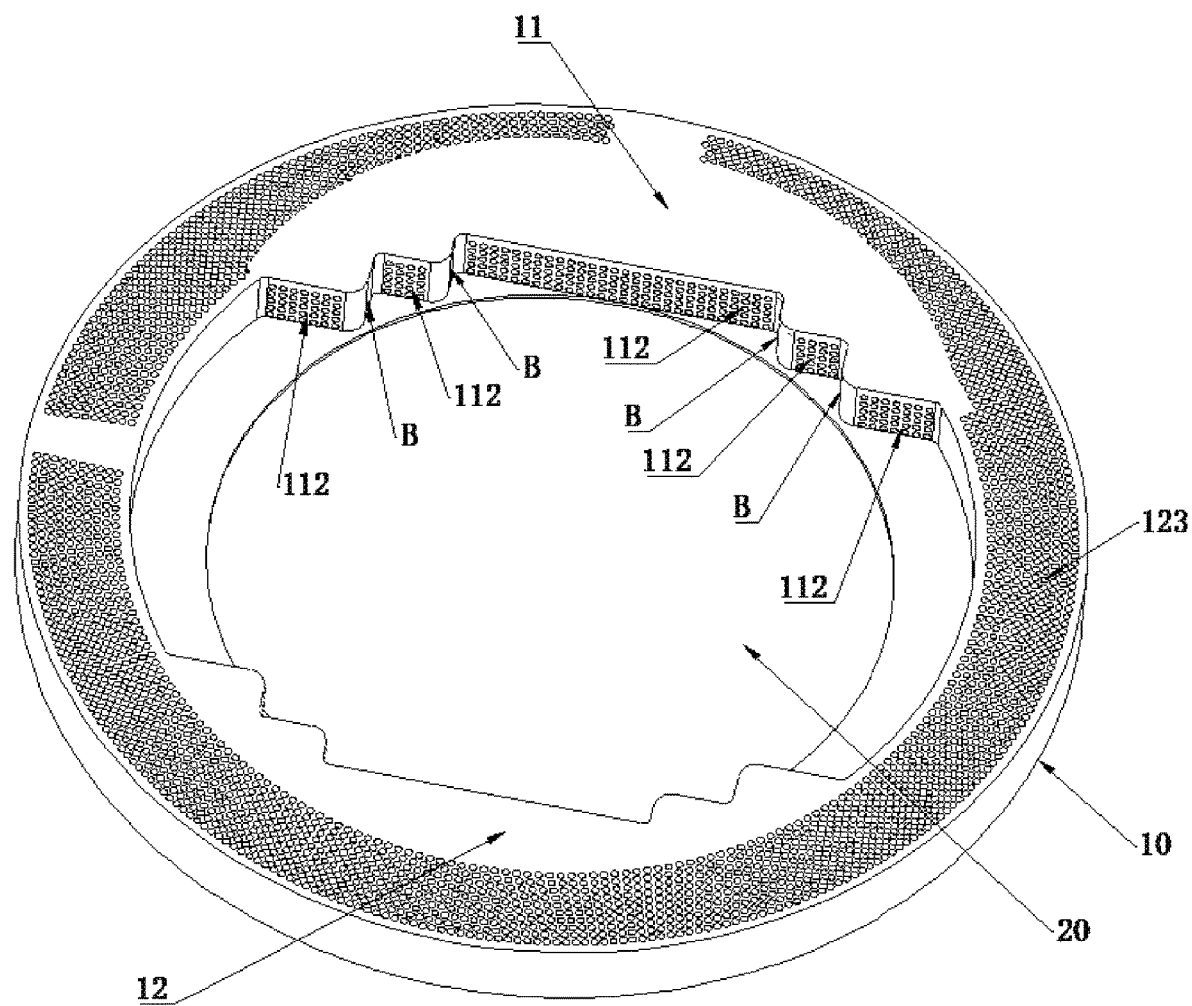
FIG. 1 is a perspective schematic view of an objective lens protection device according to an embodiment of present application.

In the figures, 10-main body; 11-gas injection unit; 111-gas inlet port; 112-gas injection port; 12-first extraction unit; 121-gas outlet port; 122-first gas extraction port; 123-second gas extraction port; 13-connecting part; 14-gas channel; 20-physical protection layer; 30-sealing element; A-gas injection surface; B-non-gas-injection surface; C-first gas extraction surface; and D-a non-gas-extraction surface.

DETAILED DESCRIPTION

The objective lens protection device, objective lens system and photolithographic apparatus proposed in the present application will be described in greater detail below with reference to the accompanying drawings and specific embodiments. Features and advantages of the application will be more apparent from the following detailed description and appended claims. It should be noted that the accompanying drawings are presented in a very simplified form and not necessarily presented to scale, with the only intention to facilitate convenience and clarity in explaining the present application.

Although the following description describes an objective lens protection device taking the photolithography machine as an example, the application of the device is not limited to the photolithography machine and also includes various types of devices having similar anti-contamination needs.

Referring to FIG. 1 to FIG. 6, in one embodiment, the provided objective lens protection device includes a main body 10 having a gas injection unit 11 and a first extraction unit 12. There is a space between the gas injection unit 11 and the first extraction unit 12 for forming at least one air curtain. The inventors have found from research that, the air curtain as a flowing gas flow is effective in isolation and protection. When the device is placed under an objective lens, during an etching process of a substrate into a photolithography machine, the air curtain is able to block a volatile organic solvent to rise up to a surface of the objective lens in the condition of the upward volatilization of the organic solvent of the surface of the silicon substrate. The formed air curtain may be either parallel to, or slightly inclined at an angle of 1° to 5° with respect to, the surface of the objective lens. The main body 10 may have any suitable structure and size as long as it does not affect the assembly or operation of the objective lens and/or other components. Those skilled in the art can design the structure and size of the main body 10 depending on specific conditions, and the present application is not particularly limited in this regard.

Additionally, referring to FIG. 2, the gas injection unit 11 may have a gas injection surface A, and the first extraction unit 12 may have a first gas extraction surface C. At least one air curtain is formed between the gas injection surface A and the first gas extraction surface C. In order to obtain a more uniform air curtain, the gas injection surface A may be arranged opposite to the first gas extraction surface C. The gas injection unit 11 may have a gas inlet port 111 (see FIG. 4) and a plurality of gas injection ports 112. The gas inlet port 111 may be configured to connect an external gas source. The plurality of gas injection ports 112 may be uniformly distributed onto the gas injection surface A and each of the plurality of gas injection ports 112 is in communication with the gas inlet port 111. The first extraction unit 12 may have a gas outlet port 121 (see FIG. 3) and a plurality of first gas extraction ports 122. The plurality of first gas extraction ports 122 are uniformly distributed on the first gas extraction surface C. Each of the plurality of first gas extraction ports 122 is in communication with the gas outlet port 121. The gas outlet port 121 may be configured to connect extraction equipment. Each of the plurality of first gas extraction ports 122 located on the first gas extraction surface C corresponds to and faces a corresponding one of the plurality of gas injection ports 112, or the plurality of first gas extraction ports 122 and the plurality of gas injection ports 112 are arranged in other manners that is able to maintain the air curtain. The first gas extraction ports 122 may be uniformly and transversely distributed so as to suck the gas from the gas injection ports 112 to form a stable air curtain at one side of the surface of the objective lens. Therefore, the uniform and cover area of the air curtain can be ensured. The formed stable air curtain may be either parallel to the surface of the objective lens or has an angle with respect to the surface of the objective lens, which can be selected by those of ordinary skilled in the art in accordance with practical situation. Specifically, each of the plurality of the first gas extraction ports 122 and the plurality of gas injection ports 112 is a circular through hole with a diameter ranging from 0.5 mm to 1 mm. Preferably, the plurality of gas injection ports 112 are uniformly distributed, and the plurality of first gas extraction ports 122 are uniformly distributed.

The first extraction unit 12 may include a first extraction chamber (not shown). In this case, the gas outlet port 121 may be in communication with the first extraction chamber so that the gas can be introduced into the first extraction chamber via the first gas extraction ports 122 and discharged through the gas outlet 121.

Figure 2A:
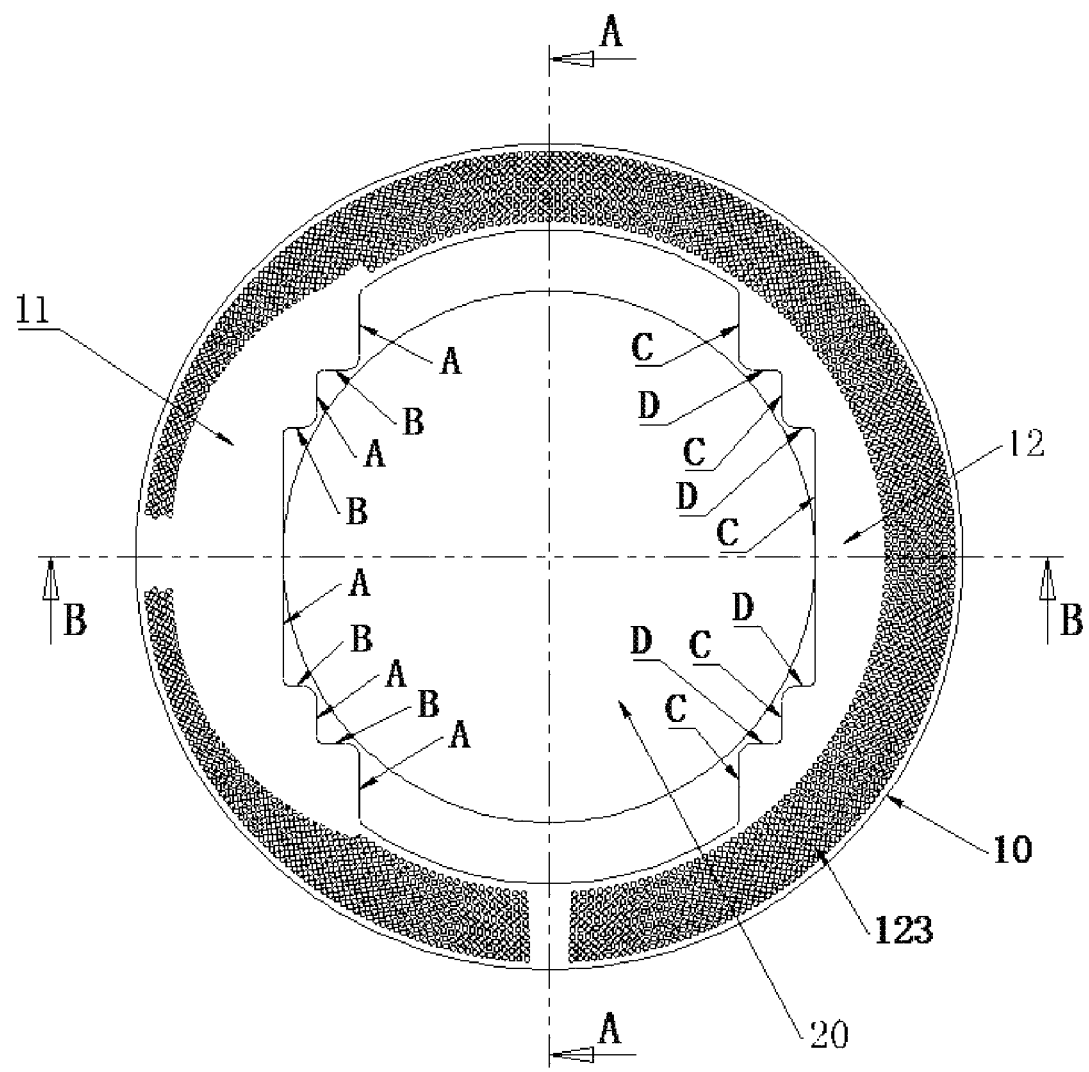
FIG. 2a is a top view of an objective lens protection device according to an embodiment of present application.
Figure 2B:
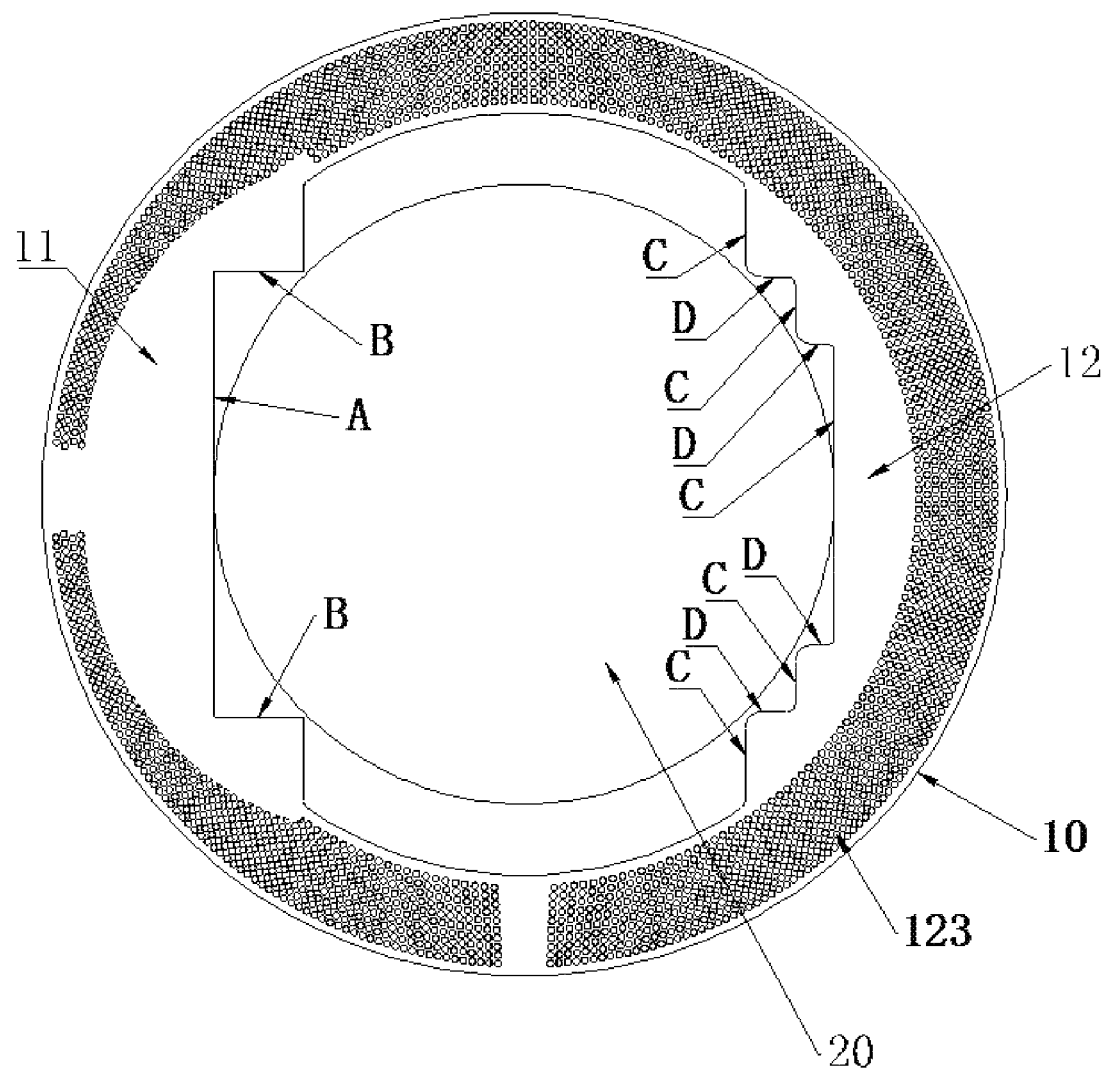
FIG. 2b and FIG. 2c are top views of an objective lens protection device according to another embodiment of present application.
Figure 2C:
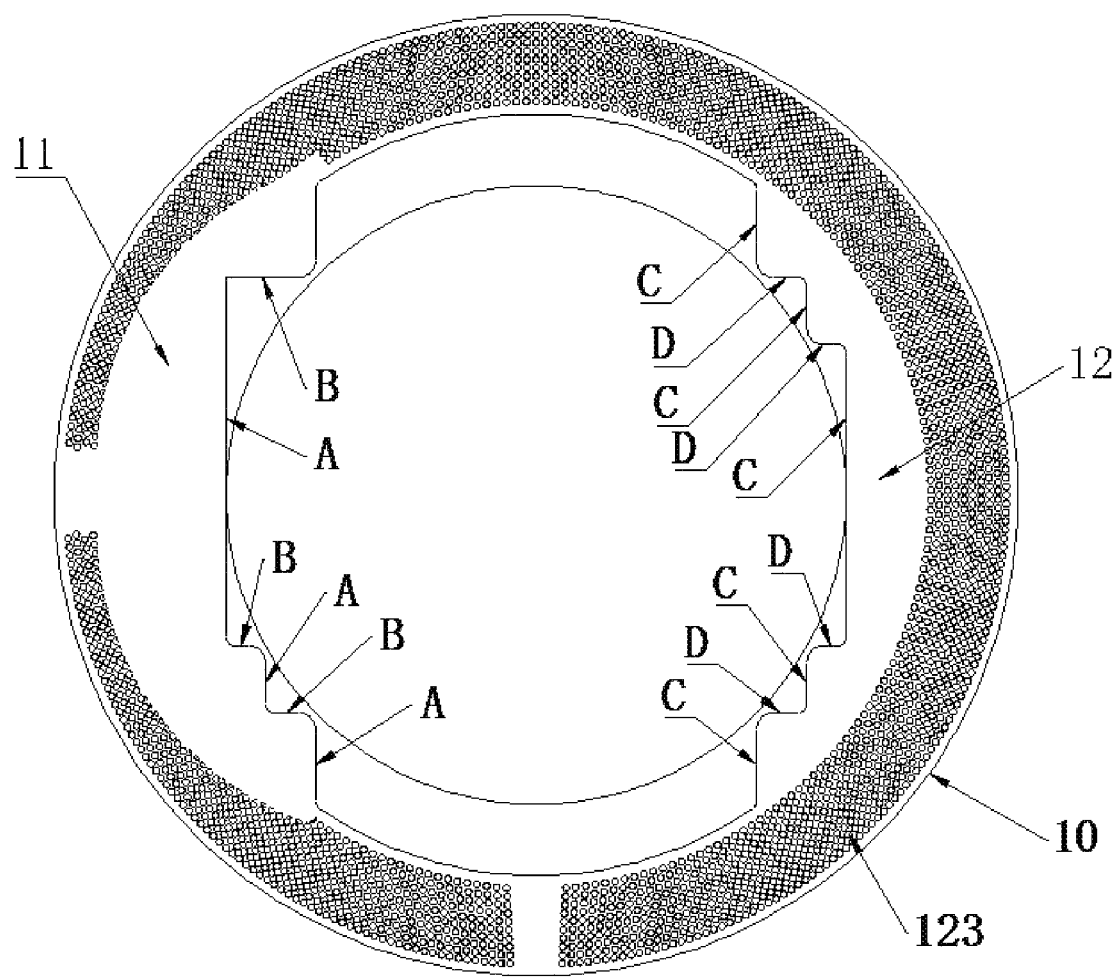

Referring to FIGS. 2a to 2c, the gas injection surface A and/or first gas extraction surface C may be stepped. The gas injection surface A may include a plurality of gas injection surface portions that are not located in a same plane, and the plurality of gas injection surface portions are parallel to each other. The gas injection surface A and/or first gas extraction surface C may either have a horizontally stepped profile as shown in FIGS. 2a to 2c, in which the plurality of gas injection surface portions have a same vertical direction and at least two gas injection surface portions locate at different positions in the horizontal axis parallel to the gas injection direction, or a vertically stepped profile, in which at least two gas injection surface portions locate at different positions in the vertical direction and at least two gas injection surface portions locate at different positions in the horizontal axis parallel to the gas injection direction. Here, the above same or different positions are only based on coordinates in the corresponding direction, and modifications to the above technical solution may be made by those of ordinary skilled in the art according to practical application.

The gas injection unit may further include non-gas-injection surfaces B. None of the gas injection ports is formed on the non-gas-injection surfaces B. An angle between one of the non-gas-injection surfaces B and a corresponding one of the gas injection surfaces A ranges from 85° to 95°, and preferably is 90°. Of course, the present application is not limited to 90°, and other angles are also available.

The gas injection surface A and/or the first gas extraction surface C may be symmetrically (e.g., axisymmetrically) distributed, and the gas injection surface A may be perpendicular to the gas injection direction of the gas injection unit 11. The first extraction unit 12 may have a first gas extraction surface C. The first gas extraction surface C is provided with a first extraction port 122, and perpendicular to the gas injection direction of the gas injection unit 11. The first gas extraction surface C may include a plurality of first gas extraction surface portions that are not in a same plane. The plurality of first gas extraction surface portions are parallel to each other. The first extraction unit 12 may also have a non-gas-extraction surface D. No first gas extraction port is formed on the non-gas-extraction surface D. An angle between one of the non-gas-extraction surfaces D and a corresponding one of the first gas extraction surfaces C ranges from 85° to 95°, and preferably is 90°. Of course, the present application is not limited to 90°, and other angles are also available.

Further, the main body 10 may also include a second extraction unit (not shown) having a second gas extraction surface. The second gas extraction surface may be annular and parallel to the horizontal plane. The second gas extraction surface may be located at a lower surface of the main body 10, and a plurality of second gas extraction ports 123 may be uniformly distributed on the second gas extraction surface. Each of the plurality of second gas extraction ports 123 formed on the second gas extraction surface may be in communication with the gas outlet port 121. The plurality of second gas extraction ports 123 distributed on the second extraction surface surround the formed air curtain. A gas extraction direction of the second gas extraction surface may be not parallel to the gas injection direction of the gas injection unit. In another embodiment of the present application, the gas extraction direction of the second gas extraction surface may be perpendicular to the gas injection direction of the gas injection unit.

The opening direction of second gas extraction ports 123 face away from the objective lens for sucking the gas flow containing volatile substances at periphery of the substrate, so that volatile substances can be completely expulsed to effectively prevent the lens or other components from contaminant. The second extraction unit may be provided with a second extraction chamber. The gas is extracted to the second extraction chamber via the second gas extraction ports before it is finally discharged out of the device. The second extraction chamber and the first evacuation chamber may either be separately arranged or incorporated to form a single extraction chamber. Specifically, the main body 10 may be a hollow structure. The main body 10 is provided with a gas channel 14 (i.e., the second extraction chamber) therein. The gas channel 14 brings all the second gas extraction ports 123 into communication with the first extraction unit 12.

Specifically, the second gas extraction port 123 may be a circular through hole with a diameter ranging from 0.5 mm to 1 mm and all second gas extraction ports 123 are uniformly distributed on the main body 10. As shown in FIG. 1, the main body 10 may be an annular cylinder, and all vertically distributed second gas extraction ports 123 are circumferentially distributed around the main body, so that the air curtain is encloses by the second gas extraction ports 123 to prevent volatile substances from reaching the objective lens disposed above the air curtain. The gas injection unit 11 and first extraction unit 12 are located at the inner side of the main body 10 and opposing arranged.

Further, the gas injection surface of the gas injection unit 11 may have a stepped profile to adapt to the annular cylinder of the main body 10, and all the gas injection ports 112 may be distributed on the stepped profile. Accordingly, the first gas extraction surface of the first extraction unit 12 has a stepped profile, and all the first gas extraction ports 122 are distributed on this stepped profile. The gas injection surface and first gas extraction surface may not interact with a working area (optical path) of the objective lens.

Figure 3:
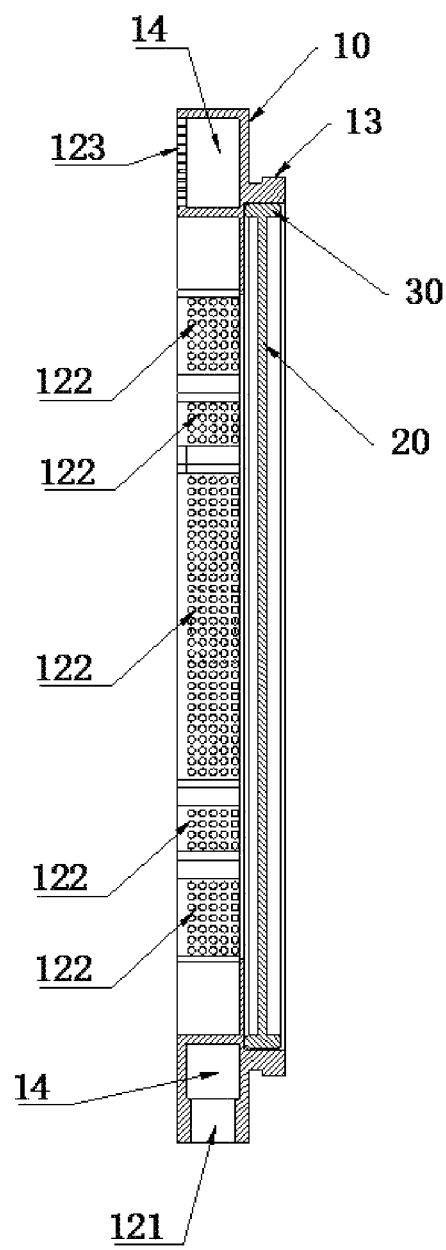
FIG. 3 is a cross-sectional view of FIG. 2a taken along A-A.

As shown in FIG. 3, the main body 10 may further include a connecting part 13 for facilitating the connection of the objective lens protection device with the objective lens. The connecting part 13 may be configured to connect the objective lens and formed at one side of the main body 10. Optionally, the connecting part 13 may be a threaded interface.

According to this embodiment, the main body 10 may be an integral structure that can be produced by three-dimensional (3D) printing. Compared to mechanical assembly, the integral structure allows significant reductions in the size to achieve the lightweight and miniaturization of the device.

Additionally, according to this embodiment, the objective lens protection device may further include a physical protection layer 20 that is connected to the main body 10 and covers the at least one air curtain. Specifically, one side of the main body 10 may include an annular groove having a size matching with the physical protection layer 20. As such, the physical protection layer 20 can be mounted into the annular groove. Preferably, the physical protection layer 20 is made of glass or resin, in particular, a circular protective glass.

Figure 4:
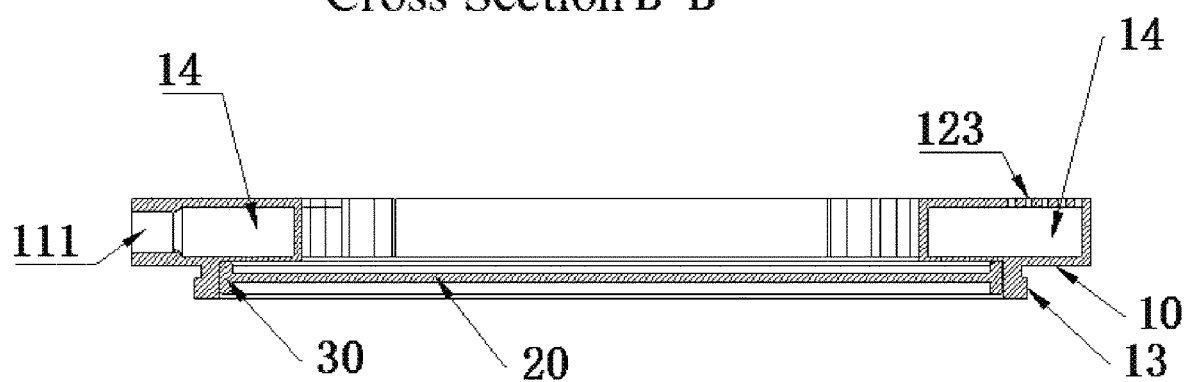
FIG. 4 is a cross-sectional view of FIG. 2a taken along B-B.
Figure 5:
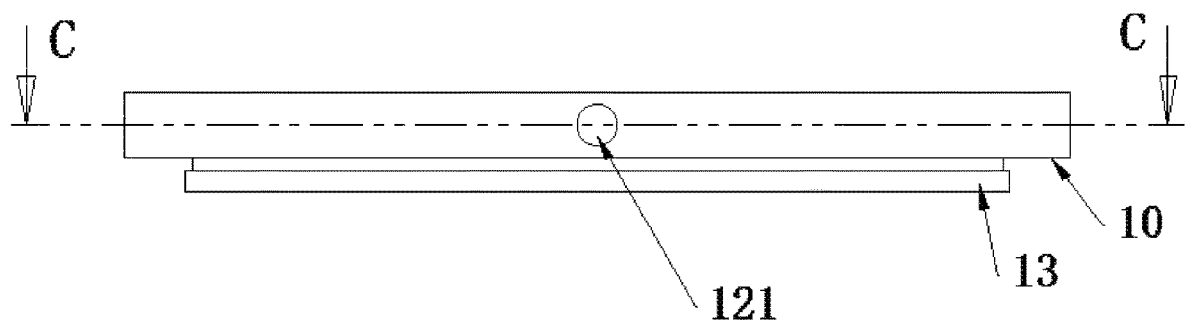
FIG. 5 is an elevation view of an objective lens protection device according to an embodiment of present application.
Figure 6:
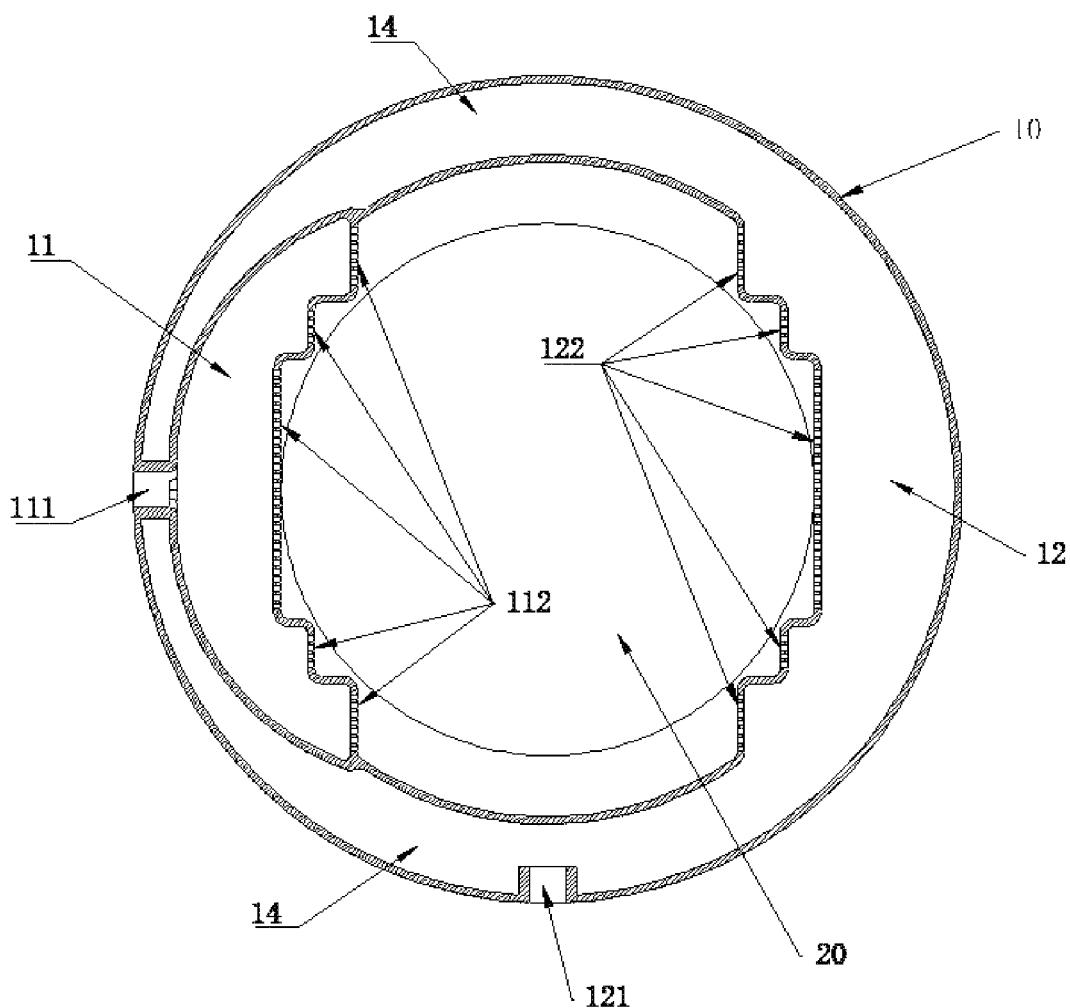
FIG. 6 is a cross-sectional view of FIG. 5 taken along C-C.

Further, as shown in FIG. 3 and FIG. 4, a sealing element 30 is disposed between the physical protection layer 20 and main body 10 to seal the space between physical protection layer 20 and the main body 10.

The method for using the objective lens protection device provided in this embodiment is as follows: activating the external gas source and extraction equipment associated with the main body 10 before starting the photolithography machine to carry out an exposure process; Moreover, when a halt of the machine is needed, in order to protect the lens and other components inside the photolithography machine from contamination, the gas-blowing device and the extraction equipment associated with the main body 10 should be shut down at last or kept operating a certain period of time, appropriately about 12 hours.

The present application also provides an objective lens system comprising the objective lens protection device as defined above. The objective lens protection device is disposed at one end of, and connected to, the objective lens system.

The application also provides a photolithographic apparatus. Each sub-system of the photolithographic apparatus belongs to the common knowledge in the art and is not described in detail herein. The photolithographic apparatus includes the objective lens system that is mounted with the objective lens protection device as defined above. The objective lens protection device is disposed between the objective lens system and the work stage of the photolithographic apparatus so as to protect the objective lens system from contaminants of gas, droplet or other types from the work stage or the workpiece during exposure and other processes.

In summary, the objective lens protection device of the present application offers the following advantages:

1. An air curtain is formed between the gas injection unit and extraction unit. When the device is in operation, the wind speed is effectively controlled to keep the wind in a laminar flow state by the uniformly and densely arranged transverse gas injection ports, thereby allowing an ensured uniform flow field for the air curtain. Moreover, with the aid of the first gas extraction ports, a layer of air curtain capable of covering the whole lens is formed, thereby enabling to effectively block the organics volatilized from bottom to up and eliminate the chance to come into direct contact with the lens. As a result, contamination of the objective lens by organic volatilization from photoresist is able to be prevented, ensuring imaging quality of the objective lens.

2. The vertical second gas extraction ports can extract organic volatilization to alleviate contamination of other components. Likewise, the uniformly and densely arranged second gas extraction ports are able to effectively control a flow field of the extraction gas flow, thereby allowing the volatile substance to be extracted out of the system without disturbing the air curtain.

3. The physical protection layer provides a secondary physical protection, allowing that no contact is present between the volatile contaminant and the lens.

4. The gas injection ports, first gas extraction ports and second gas extraction ports are all uniformly and densely arranged circular through-holes, enabling to effective control flow rate of the gas injection flow and gas extraction flow to keep them in a laminar flow state. As a result, the stable air curtain is able to be ensured, and a good blockage effect of the air curtain and a sufficient extraction are able to be proved.

5. The main body is integrally formed, allowing the device to be more compact and space-saving.

The embodiments disclosed herein are described in a progressive manner, with the description of each embodiment focusing on its differences from the other embodiments. References can be made between the embodiments for the same or similar features. As the system disclosed in embodiments corresponds to the method disclosed in embodiments, its description is relatively simplified, and references can be made to the description of the method for details.

The description above is merely a few preferred embodiments of the present application and not intended to limit the scope of the present application in any sense. Any change and modification made by those of ordinary skilled in the art based on the above disclosure fall within the protection scope of the appended claims.

What is claimed is:

1. An objective lens protection device, comprising a main body, the main body having a gas injection unit and a first extraction unit that are oppositely arranged, the gas injection unit configured to deliver a gas, the first extraction unit configured to extract the gas delivered by the gas injection unit, so as to form at least one layer of air curtain between the gas injection unit and the first extraction unit, wherein the gas injection unit has a gas injection surface that is provided with a plurality of gas injection ports thereon, and the first extraction unit has a first gas extraction surface that is provided with a plurality of first gas extraction ports thereon, wherein the gas injection surface and/or the first gas extraction surface has a stepped profile.

2. The objective lens protection device of claim 1, wherein the main body further comprises a connecting part that is configured to connect the objective lens and located at one side of the main body.

3. The objective lens protection device of claim 1, further comprising a physical protection layer that is connected to the main body and located between an objective lens to be protected and the at least one layer of air curtain.

4. The objective lens protection device of claim 3, further comprising a sealing element that is configured to seal a gap between the physical protection layer and the main body and is located between the physical protection layer and the main body.

5. The objective lens protection device of claim 1, wherein the main body is integrally formed.

6. The objective lens protection device of claim 1, wherein the gas injection surface and the first gas extraction surface are axisymmetrically distributed.

7. The objective lens protection device of claim 1, wherein the gas injection surface comprises a plurality of gas injection surface portions that are not located in a same plane, and the plurality of gas injection surface portions are parallel to each other.

8. The objective lens protection device of claim 7, wherein the gas injection unit further comprises a plurality of non-gas-injection surfaces, wherein each of the non-gas-injection surfaces is configured to connect two adjacent gas injection surface portions and has no gas injection port.

9. The objective lens protection device of claim 8, wherein an angle between one of the non-gas-injection surfaces and a corresponding one of the gas injection surface portions is 85°-95°.

10. The objective lens protection device of claim 1, wherein the first gas extraction surface comprises a plurality of first gas extraction surface portions that are not located in a same plane, and the plurality of first gas extraction surface portions are parallel to each other.

11. The objective lens protection device of claim 10, wherein the first extraction unit further comprises non-gas-extraction surfaces, wherein each of the non-gas-extraction surfaces is configured to connect two adjacent gas extraction surface portions and has no first gas extraction port.

12. The objective lens protection device of claim 11, wherein an angle between one of the non-gas-extraction surfaces and the first gas extraction surfaces is 85°-95°.

13. The objective lens protection device of claim 1, wherein the gas injection unit further comprises a gas inlet port that is in communication with each of the plurality of gas injection ports, and the first extraction unit further comprises a gas outlet port that is in communication with each of the plurality of first gas extraction ports.

14. The objective lens protection device of claim 1, wherein the main body further comprises a second extraction unit having an annular second gas extraction surface, and wherein the second gas extraction surface is located at a lower surface of the main body.

15. The objective lens protection device of claim 14, wherein the second gas extraction surface is provided with a plurality of second gas extraction holes.

16. The objective lens protection device of claim 14, wherein a gas extraction direction of the second gas extraction surface is not parallel to, the gas injection direction of the gas injection unit.

17. The objective lens protection device of claim 16, wherein the gas extraction direction of the second gas extraction surface is perpendicular to the gas injection direction of the gas injection unit.

18. The objective lens protection device of claim 14, wherein the second extraction unit is provided with a second extraction chamber, into which a gas is extracted by the second gas extraction surface.

19. The objective lens protection device of claim 18, wherein the first extraction unit comprises a first extraction chamber and wherein the first extraction chamber and the second extraction chamber are in communication with each other.

20. The objective lens protection device of claim 19, wherein the first extraction chamber is in communication with a gas outlet port, and wherein a gas is extracted and enters into the first extraction chamber through the plurality of first gas extraction ports and discharged through the gas outlet port.

21. An objective lens system, comprising an objective lens protection device of claim 1.

22. A photolithographic apparatus, comprising an objective lens system of claim 21.

23. The objective lens protection device of claim 1, wherein the gas injection surface is perpendicular to a gas injection direction of the gas injection unit.

24. The objective lens protection device of claim 1, wherein each of the plurality of gas injection ports corresponds to and is arranged opposite to a corresponding one of the plurality of first gas extraction ports.

* * * * *